US007671642B2

(12) United States Patent
Payrard et al.

(10) Patent No.: US 7,671,642 B2
(45) Date of Patent: Mar. 2, 2010

(54) AMPLITUDE CONTROLLED SAWTOOTH GENERATOR

(75) Inventors: Daniel Payrard, St. Maximin (FR); Michel Cuenca, Septemes les Vallons (FR); Eric Brunet, Pourrieres (FR)

(73) Assignee: Atmel Corporation, San Jose, CA (US)

( * ) Notice: Subject to any disclaimer, the term of this patent is extended or adjusted under 35 U.S.C. 154(b) by 47 days.

(21) Appl. No.: 11/610,107

(22) Filed: Dec. 13, 2006

(65) Prior Publication Data

US 2008/0143394 A1    Jun. 19, 2008

(51) Int. Cl.
*H03K 4/06* (2006.01)
(52) U.S. Cl. ...................................................... 327/140
(58) Field of Classification Search ................. 327/131, 327/132, 133, 134, 135, 136, 137, 138, 139, 327/140
See application file for complete search history.

(56) References Cited

U.S. PATENT DOCUMENTS

| 4,041,405 | A | | 8/1977 | Davis |
| 4,284,906 | A | | 8/1981 | Manfredi |
| 5,121,085 | A | | 6/1992 | Brown |
| 5,394,020 | A | * | 2/1995 | Nienaber ..................... 327/140 |
| 5,502,410 | A | * | 3/1996 | Dunn et al. .................. 327/140 |
| 5,502,419 | A | * | 3/1996 | Kawasaki et al. ............ 332/109 |
| 5,574,392 | A | | 11/1996 | Jordan |
| 5,943,382 | A | | 8/1999 | Li et al. |
| 6,127,896 | A | | 10/2000 | Burzio |
| 6,791,405 | B2 | * | 9/2004 | Tsuji et al. .................... 330/10 |
| 6,885,331 | B2 | | 4/2005 | Krymski |
| 6,906,581 | B2 | * | 6/2005 | Kang et al. .................. 327/539 |
| 6,927,610 | B2 | | 8/2005 | Callahan, Jr. |
| 6,954,511 | B2 | | 10/2005 | Tachimori |
| 6,989,718 | B2 | * | 1/2006 | Pretl et al. ..................... 331/16 |
| 7,038,509 | B1 | * | 5/2006 | Zhang ......................... 327/157 |
| 7,075,470 | B2 | | 7/2006 | Lee |
| 7,088,962 | B2 | | 8/2006 | Anand et al. |

(Continued)

FOREIGN PATENT DOCUMENTS

JP    WO2004062104 A2    7/2004

OTHER PUBLICATIONS

"U.S. Appl. No. 11/624,139, Notice of Allowance mailed Oct. 2, 2007", 6 pgs.

(Continued)

*Primary Examiner*—Jeffrey S Zweizig
(74) *Attorney, Agent, or Firm*—Schwegman, Lundberg & Woessner, P.A.

(57) ABSTRACT

A sawtooth voltage generator has a first capacitor that is charged with a variable feedback control current to provide a sawtooth output signal with a controlled amplitude. A feedback loop includes a comparator that compares a version of the sawtooth output signal with a fixed voltage reference to provide a comparator output signal to a phase frequency comparator, the output of which controls a source of the variable feedback control current. A method includes controlling the amplitude of a sawtooth output signal by charging a capacitor in a sawtooth voltage generator with a variable feedback control current; comparing a version of the sawtooth output signal with a fixed reference voltage to provide a comparator output signal; processing the comparator output signal in a phase frequency comparator to provide up/down control signals; and controlling the variable feedback control current with the up/down control signals from the phase frequency comparator.

25 Claims, 13 Drawing Sheets

U.S. PATENT DOCUMENTS

| | | |
|---|---|---|
| 7,256,623 B2 | 8/2007 | Day et al. |
| 7,312,645 B1 * | 12/2007 | Brunn ........................ 327/147 |
| 7,336,110 B1 | 2/2008 | Payrard et al. |
| 7,368,959 B1 | 5/2008 | Xu et al. |
| 7,391,242 B1 | 6/2008 | Ball |
| 2005/0013343 A1 | 1/2005 | Giunco et al. |
| 2006/0176933 A1 | 8/2006 | Uemura et al. |

OTHER PUBLICATIONS

"U.S. Appl. No. 12/014,261, Non-Final Office Action mailed Nov. 4, 2009", 6 Pgs.

* cited by examiner

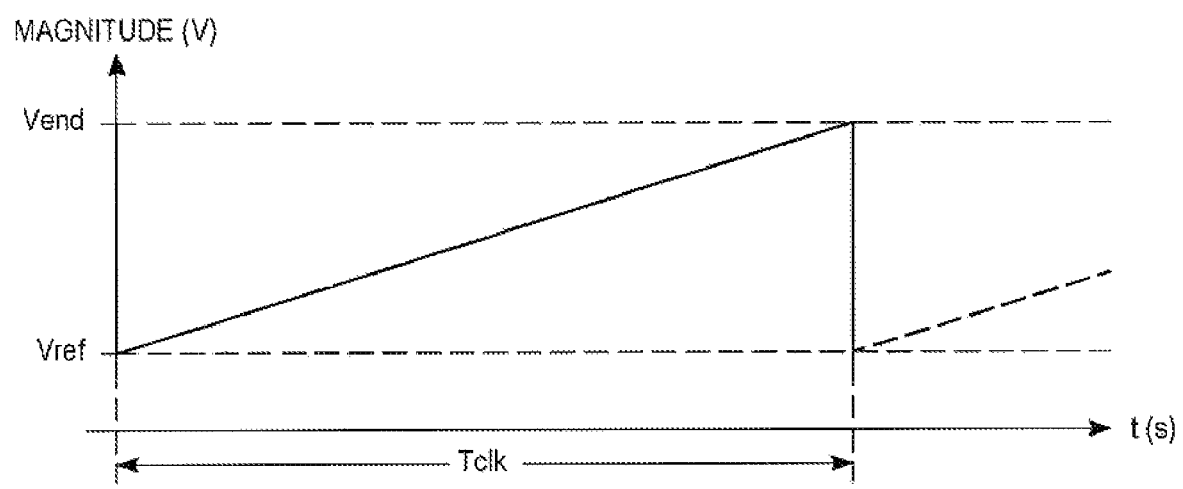
Fig._1

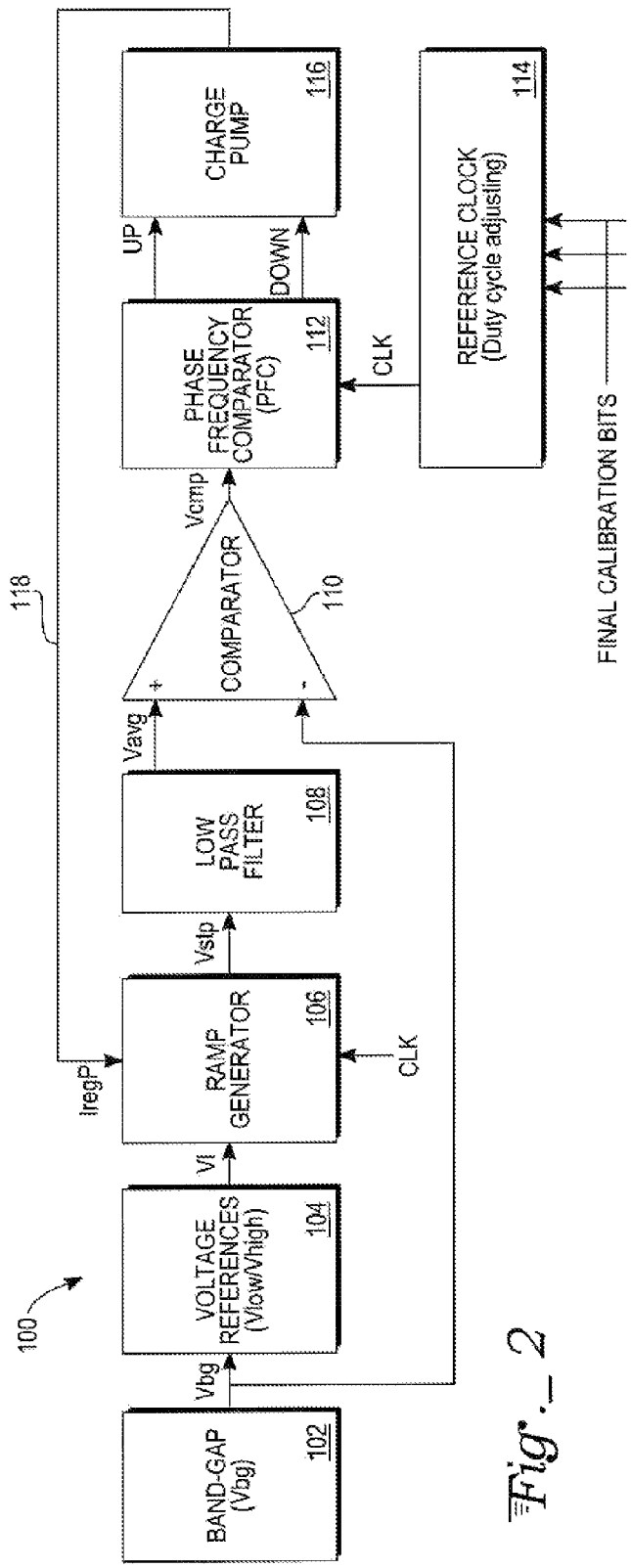
_Fig._ _2_
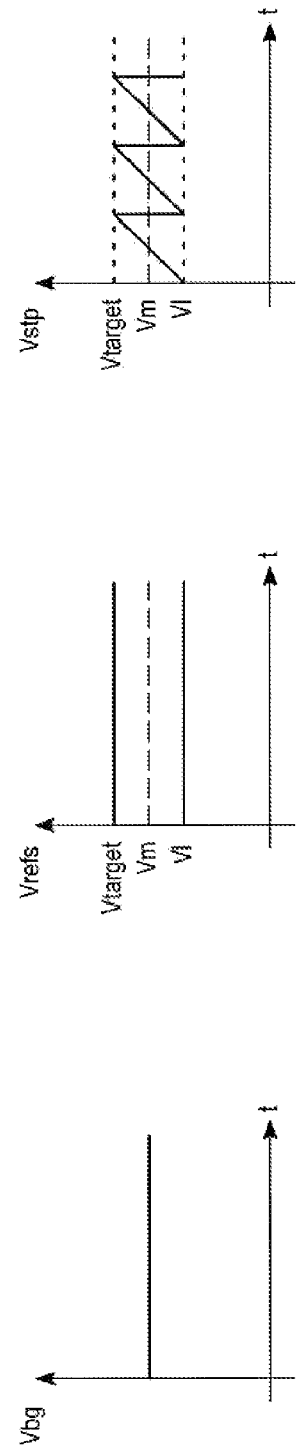
_Fig._ _5_
_Fig._ _4_
_Fig._ _3_

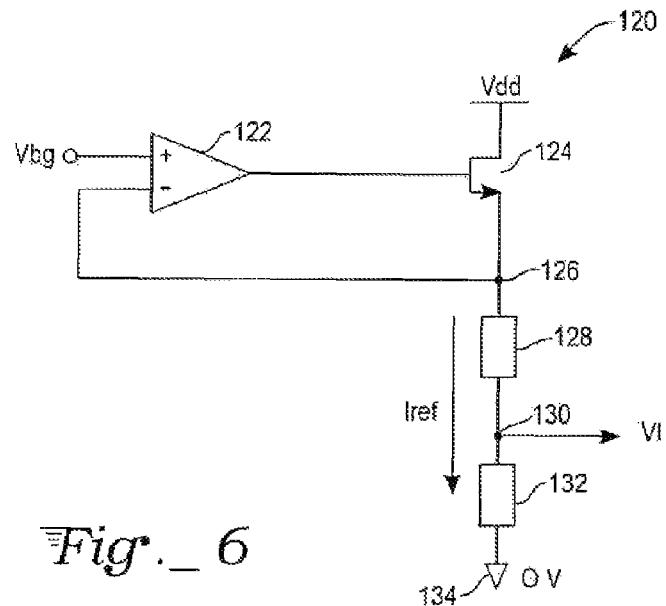
Fig._6
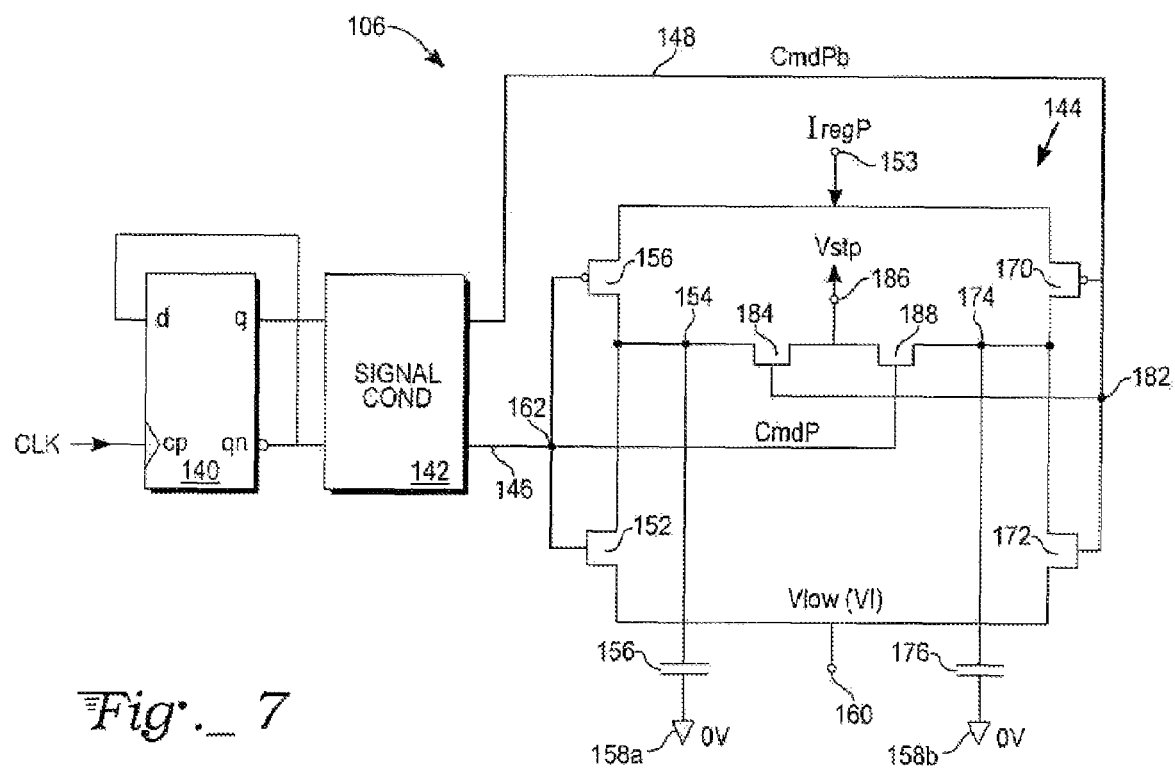
Fig._7

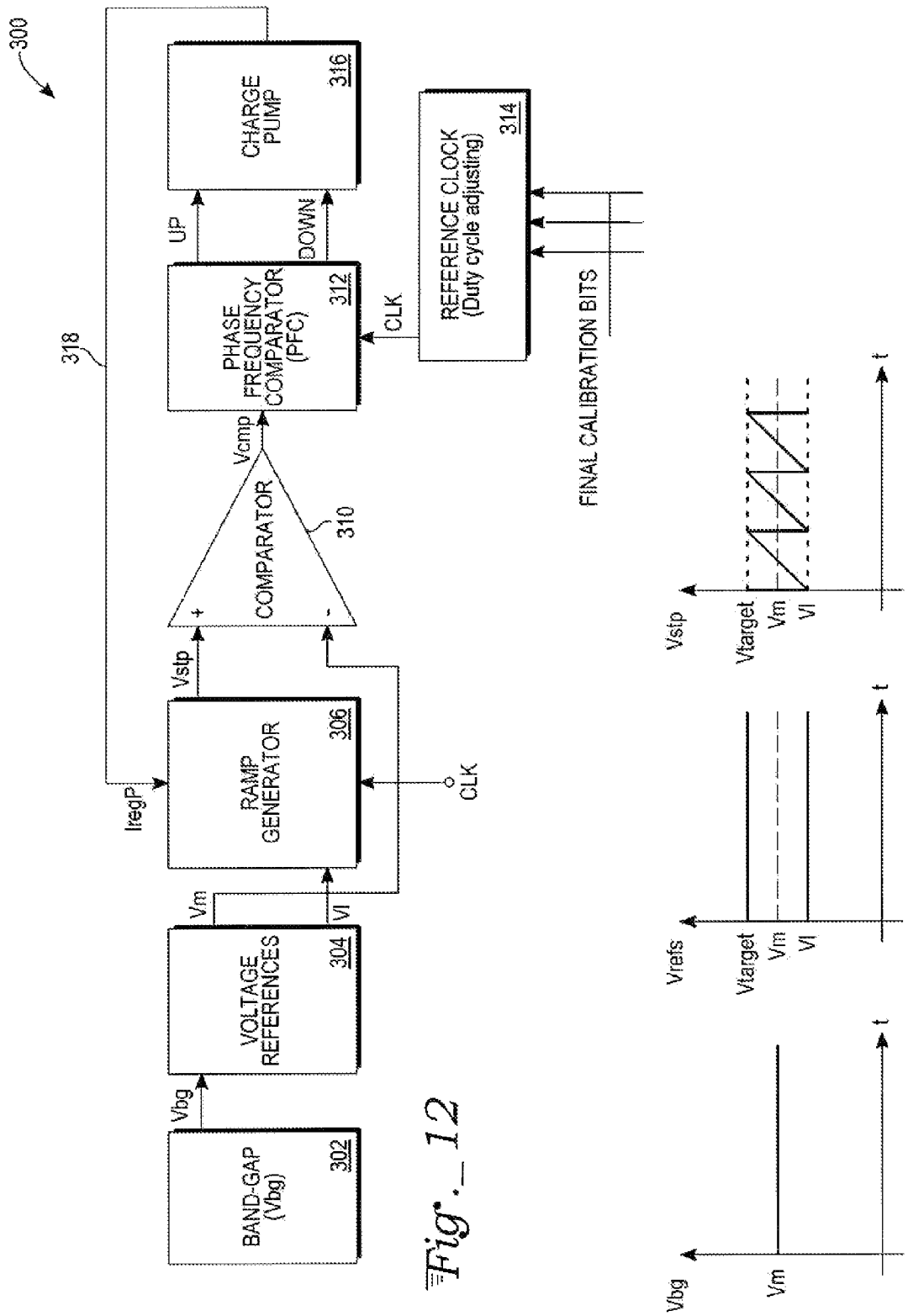
Fig._12
Fig._13
Fig._14
Fig._15

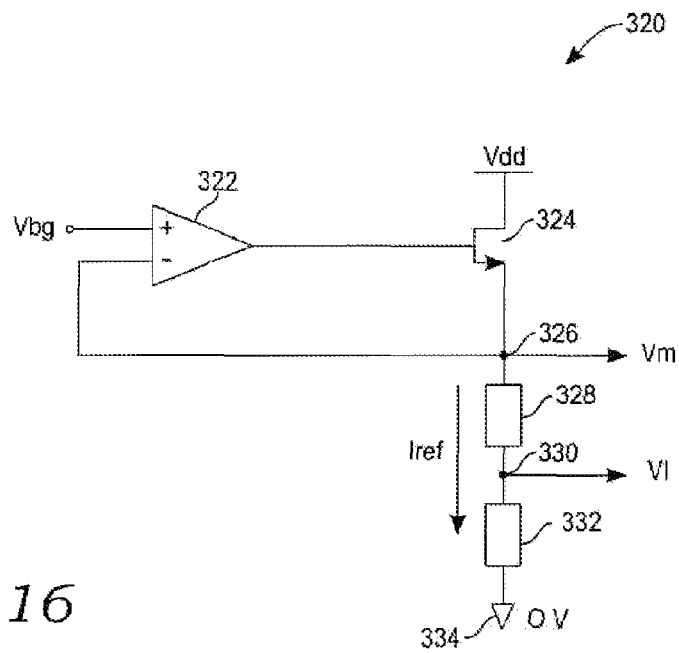
Fig._16
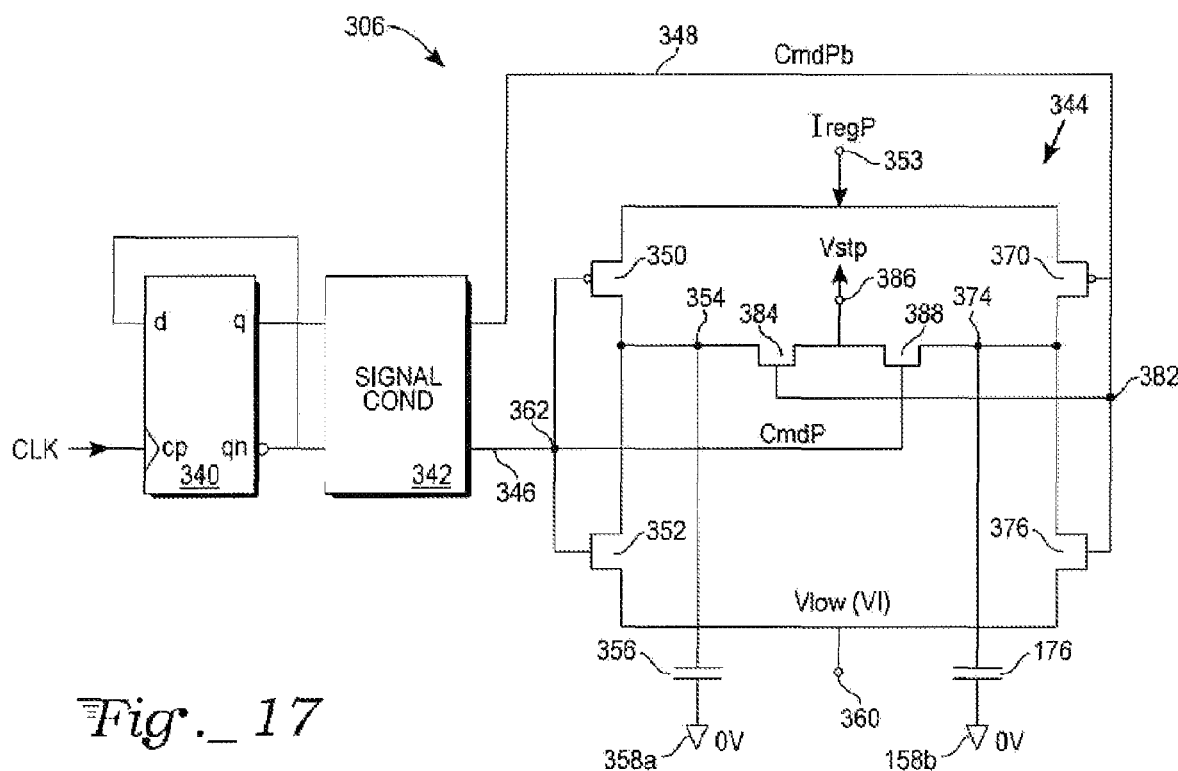
Fig._17

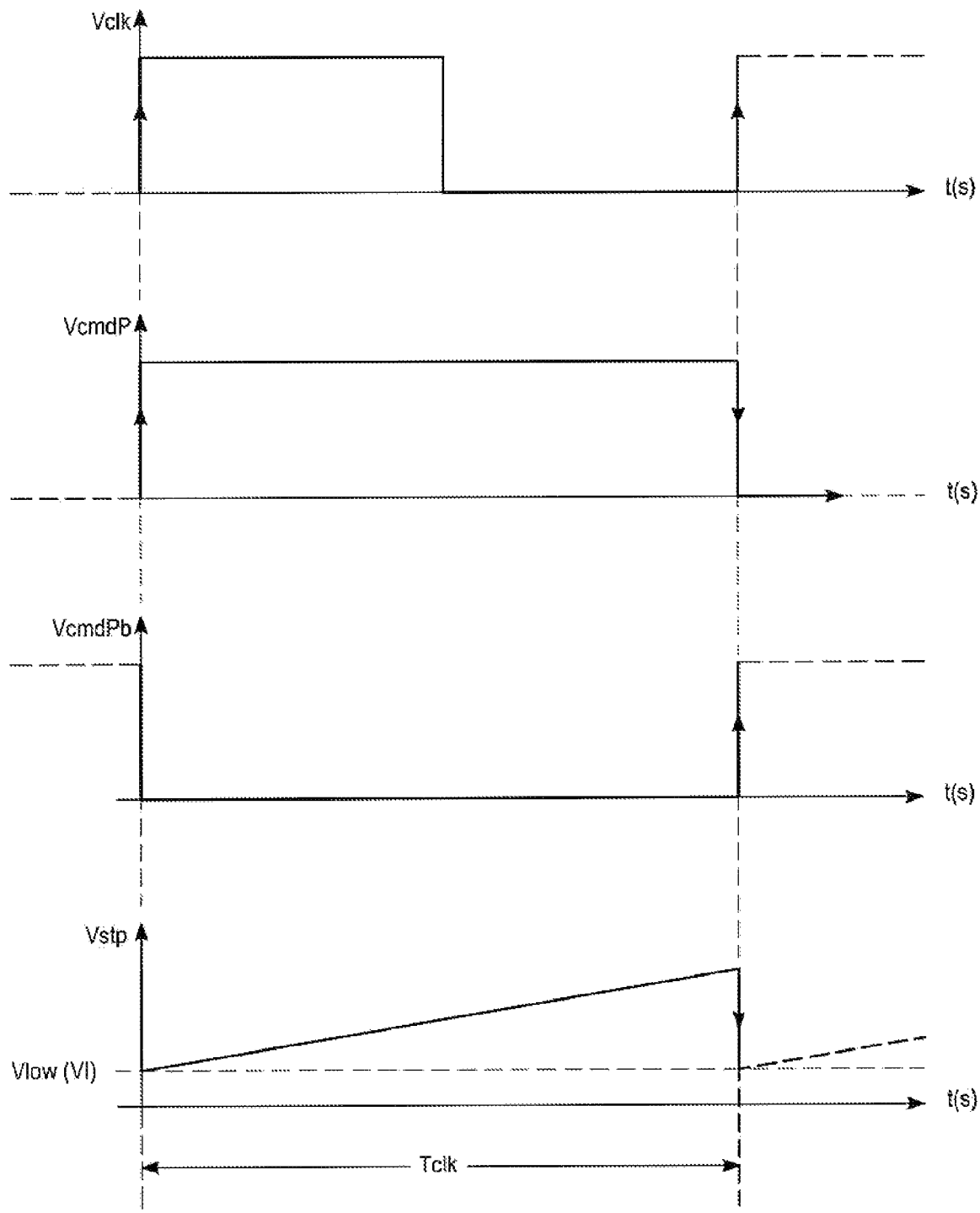
Fig._18

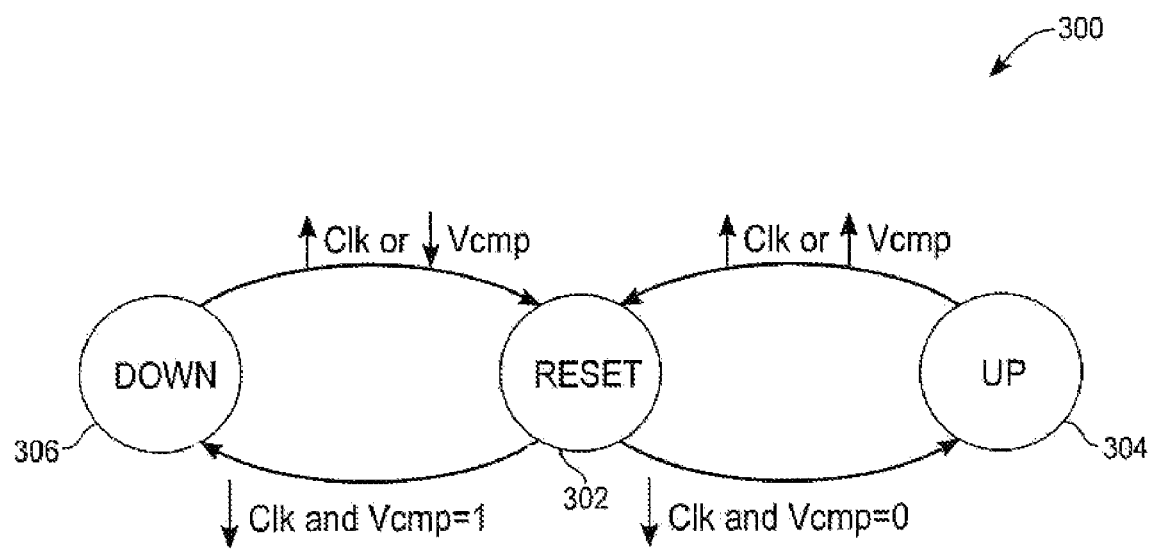
Fig._19

AMPLITUDE CONTROLLED SAWTOOTH GENERATOR

CROSS-REFERENCE TO RELATED APPLICATIONS

This application is related to application Ser. No. 11/624,139, filed Jan. 17, 2007, now issued as U.S. Pat. No. 7,336,110 and entitled "Differential Amplitude Controlled Sawtooth Generator" and to application Ser. No. 12/014,261, filed Jan. 15, 2008 and entitled "Differential Amplitude Controlled Sawtooth Generator."

TECHNICAL FIELD

This invention relates to a sawtooth signal generator providing a controlled sawtooth signal amplitude.

BACKGROUND

FIG. 1 shows a waveform for a sawtooth signal that is generated by charging a capacitor with a constant current source. The magnitude (M) of the sawtooth signal generated by having a charging current (I) charge a capacitor (C) is given by:

$$M = Vend - Vref = \frac{I * Tclk}{C},$$

where Tclk is the period of the sawtooth signal, Vref is the starting voltage, and Vend is the ending voltage of the sawtooth signal. The charging current (I) can be provided by a band-gap voltage (Vbg) and a resistor (R). The charging current for charging the capacitor (C) is given by: I: Vbg/R so that the magnitude of the sawtooth can be written as $$M = \frac{Vbg * Tclk}{R * C}.$$

Variations in the values of fabricated resistors have a range of plus and minus 30 percent, while variations in fabricated capacitors have a range of plus and minus 20 percent, depending on fabrication process variations. Thus, the magnitude of a sawtooth signal can vary over a range of minus 36 percent to plus 78 percent. This range for the magnitude, or amplitude, of a sawtooth signal is not acceptable for a system requiring a high level of accuracy. Consequently, a simple charging circuit for a sawtooth generator requires trimming to adjust the magnitude of the sawtooth signal to a desired value. Consequently, a sawtooth generator is required which can provide a sawtooth output signal having a magnitude that is accurate in spite of process variations in component values.

SUMMARY OF THE INVENTION

A sawtooth signal generator provides a sawtooth output signal having a controlled amplitude. A sawtooth voltage generator has a first capacitor that is charged with a variable feedback control current to provide a sawtooth output signal with an amplitude controlled by the variable control current. A feedback loop includes a comparator that compares a version of the sawtooth output signal with a fixed voltage reference and that provide a comparator output signal to a phase frequency comparator, the output of which controls a source of the variable feedback control current.

A dual-capacitor sawtooth generation circuit includes a sawtooth generator control circuit that receives a reference clock signal and that provides a first sawtooth command signal and a second complementary sawtooth command signal to a sawtooth voltage generator circuit. The sawtooth voltage generator circuit includes a first sawtooth capacitor and a second sawtooth capacitor. The sawtooth voltage generator circuit receives: a low voltage reference voltage, the first sawtooth command signal, the second complementary sawtooth command signal, and a control current signal. The sawtooth voltage generator circuit has an output terminal at which is provided sawtooth output signal. The first sawtooth command signal and the second complementary sawtooth command signal alternatively connect one of the first and second sawtooth capacitors to the control current signal and to the output terminal for the sawtooth output signal while also connecting the other of the first and second sawtooth capacitors to the low voltage reference voltage so that each of the sawtooth capacitors alternately provides a sawtooth output signal that starts at the low voltage level to the output terminal.

A sawtooth generator also includes a dual-capacitor sawtooth voltage generator circuit that includes a first sawtooth capacitor and a second sawtooth capacitor, that receives a low voltage reference voltage, that receives a first sawtooth command signal, that receives a second complementary sawtooth command signal, that receives a feedback current signal from a charge pump circuit, and that has a sawtooth output terminal at which is provided a sawtooth output signal. The first sawtooth command signal and the second complementary sawtooth command signal alternatively couple one of the first and second sawtooth capacitors to the feedback current signal and to the sawtooth output terminal while also coupling the other of the first and second sawtooth capacitors to the low voltage reference voltage so that each of the sawtooth capacitors alternately provides a sawtooth output signal that starts at the low voltage reference voltage. A comparator circuit compares a reference voltage level to a version of the sawtooth output signal and provides a comparator output signal. A phase frequency comparator receives the comparator output voltage and a clock signal and provides as outputs an UP signal and a DOWN signal. The UP signal indicates that the version of the sawtooth signal is greater than the reference voltage level and the DOWN signal indicates that the version of the sawtooth signal is less than the reference voltage level. A charge pump circuit receives the UP signal to provide an increase in the feedback current signal and receives the DOWN signal to provide a decrease in the feedback current signal.

A method of generating a sawtooth signal is provided that has a controlled amplitude. The method includes the steps of: controlling the amplitude of a sawtooth output signal by charging a capacitor in a sawtooth voltage generator with a variable feedback control current; comparing a version of the sawtooth output signal with a fixed reference voltage to provide a comparator output signal; processing the comparator output signal in a phase frequency comparator to provide up/down control signals; and controlling a source of the variable feedback control current with the up/down control signals from the phase frequency comparator.

BRIEF DESCRIPTION OF THE DRAWINGS

The accompanying drawings, which are incorporated in and form a part of this specification, illustrate embodiments of the invention and, together with the description, serve to explain the principles of the invention:

FIG. 1 is a waveform for a sawtooth signal.

FIG. 2 is a block diagram of one embodiment of an amplitude controlled sawtooth generator that is controlled using an average value of a sawtooth signal that is compared to a reference voltage.

FIG. 3 is a waveform diagram showing a band gap voltage Vbg.

FIG. 4 is a waveform diagram showing a target high voltage Vtarget level and a low voltage Vl level for the amplitude controlled sawtooth generator of FIG. 2.

FIG. 5 is a waveform diagram showing a sawtooth voltage waveform for the amplitude controlled sawtooth generator of FIG. 2.

FIG. 6 is a circuit diagram of a voltage reference block that provides a low voltage Vl for the amplitude controlled sawtooth generator of FIG. 2.

FIG. 7 is a circuit diagram of a sawtooth voltage generator for the amplitude controlled sawtooth generator of FIG. 2.

FIG. 12 is a block diagram of another embodiment of an amplitude controlled sawtooth generator that is controlled with a fixed average reference voltage.

FIG. 13 is a waveform diagram showing an average voltage Vm level for the amplitude controlled sawtooth generator of FIG. 12.

FIG. 14 is a waveform diagram showing a low voltage Vl level, a Vm voltage level, and a Vtarget voltage level for the amplitude controlled sawtooth generator of FIG. 12.

FIG. 15 is a waveform diagram showing a sawtooth voltage waveform for an output signal of the for the amplitude controlled sawtooth generator of FIG. 12

FIG. 16 is a circuit diagram of a voltage reference block that provides a low voltage Vl and an average voltage Vm for the amplitude controlled sawtooth generator of FIG. 12.

FIG. 17 is a circuit diagram of a sawtooth voltage generator for the amplitude controlled sawtooth generator of FIG. 12.

FIG. 18 is a timing diagram showing various voltage waveforms for sawtooth voltage generator of FIG. 17.

FIG. 19 is a state transition diagram for a phase frequency comparator for the amplitude controlled sawtooth generator of FIG. 12.

DETAILED DESCRIPTION

Figure 8:
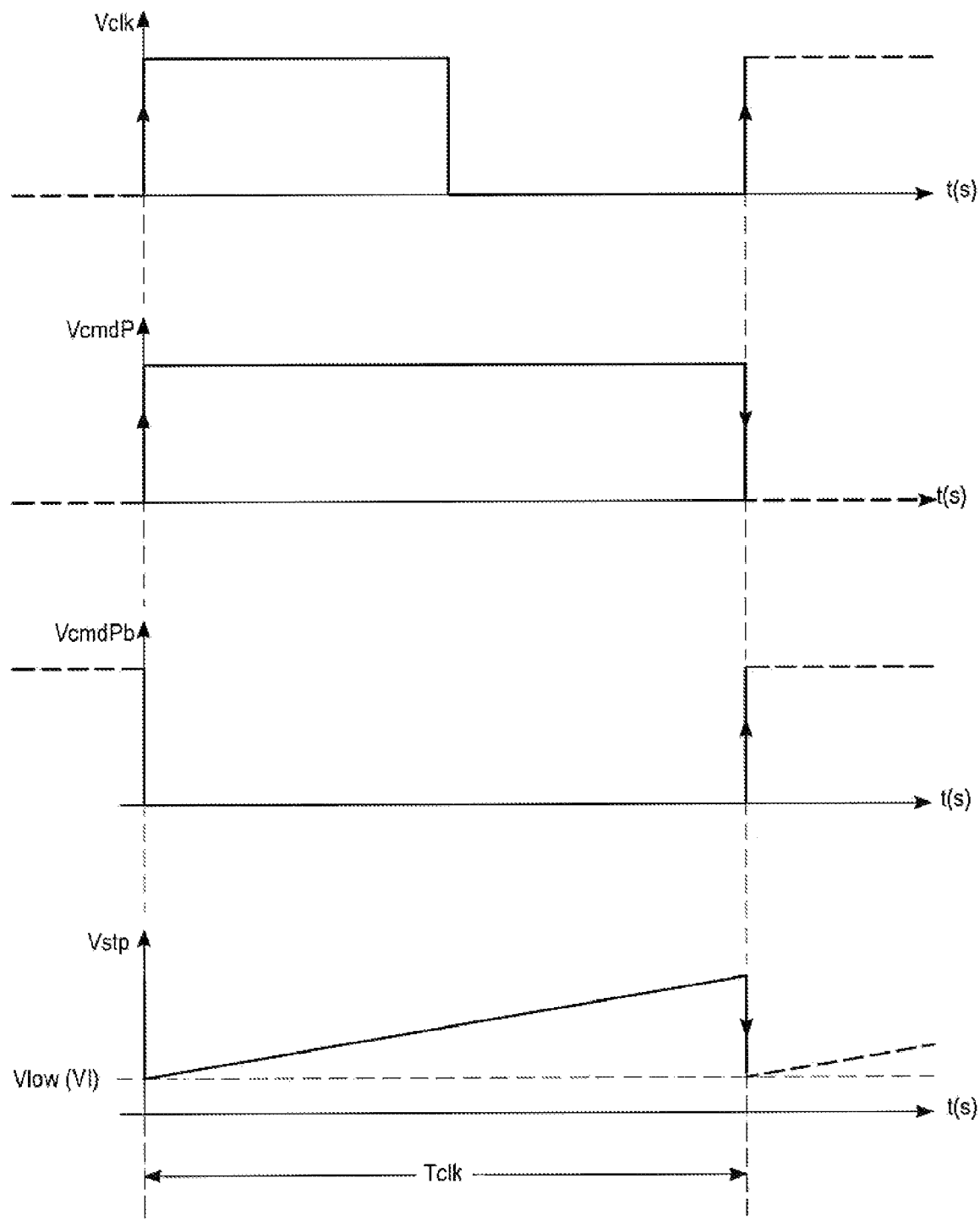
FIG. 8 is a timing diagram showing various voltage waveforms for the sawtooth voltage generator of FIG. 7.

An Amplitude Controlled Sawtooth Generator Based on the Average Magnitude of a Sawtooth Signal FIG. 2 illustrates one embodiment of a sawtooth signal generator system 100. The sawtooth signal generator system 100 is controlled using a version of the sawtooth signal that is an average value of the magnitude of a sawtooth output signal and that is compared to a reference voltage. A voltage reference circuit 102, such as a bandgap source, provides, for example, a bandgap voltage Vbg as an input bandgap reference voltage to a voltage reference circuit 104. The voltage reference circuit 104 provides a low voltage Vl reference voltage to a sawtooth signal generator 106.

The sawtooth signal generator 106 receives a CLK signal and is controlled by a feedback current signal IregP. The sawtooth signal generator 106 provides an output sawtooth signal Vstp. A low pass filter 108 filters the Vstp signal to provide an average value signal Vavg representing the magnitude of the sawtooth signal Vstp from the sawtooth signal generator 106.

A positive input terminal of a voltage comparator 110 receives the Vavg signal. A negative input terminal of the comparator 110 receives the bandgap reference voltage Vbg. The voltage comparator 110 compares the Vavg signal of the sawtooth voltage Vstp to the band gap voltage Vbg of the band-gap circuit 102 and provides a comparator output signal Vcmp.

If the magnitude of the average of the sawtooth (Vavg) signal is less than the bandgap voltage level (Vbg), the output voltage signal Vcmp of the voltage comparator 110 is LOW, or zero volts. If the magnitude of the average of the sawtooth Vavg is greater than Vbg, the output voltage signal Vcmp of the voltage comparator 110 is HIGH.

A phase frequency comparator (PFC) 112 compares the comparator output signal Vcmp with the falling edge of a reference CLK output signal from a reference clock circuit 114. As discussed herein below in connection with FIG. 9, an embodiment of the PFC 112 is implemented as a state machine. The clock circuit 114 includes final calibration bits for adjusting the CLK duty cycle. For each period of, the CLK signal, the PFC 112 provides either an UP output signal or a DOWN output signal to a charge pump circuit 116. The charge pump circuit 116 provides the output current IregP to the sawtooth signal generator 106 on a signal line 118. A current feedback loop is formed by the sawtooth signal generator 106, the low pass filter 108, the voltage comparator 110, the PFC 112, and the charge pump 116 that provides the IregP signal to the sawtooth generator 106 to regulate the amplitude of the sawtooth signal Vstp from the sawtooth generator 106.

FIG. 3 shows the band gap voltage (Vbg) level from the voltage reference circuit 102 for the amplitude controlled sawtooth generator of FIG. 2. Vm is the average or mean of the output sawtooth signal Vstp.

FIG. 4 shows a Vtarget voltage level and a low voltage Vl level from the voltage references circuit 104 of FIG. 2. The starting point voltage level for the sawtooth signal waveform is the low voltage Vl level. The Vtarget voltage level is the targeted high voltage level of the sawtooth signal.

FIG. 5 shows the output of the sawtooth signal generator 106 as a sawtooth signal Vstp that is centered on the average, or mean, value Vm.

FIG. 6 is a diagram of the voltage reference circuit 120 for the voltage reference block 104 that provides a Vl voltage level. The bandgap voltage into the voltage reference block 104 (see FIG. 2) generates the regulated voltage Vl. The Vm voltage may or may not be centered on the band-gap voltage value. As an example, let the band-gap voltage Vbg be 1.20 V. If a sawtooth voltage with a magnitude of 200 mV is desired, the voltage references block 104 generates a Vl voltage of 1.100 volts so that the magnitude of the sawtooth signal is 0.200 volts, or 200 mV. The voltage references circuit 102 can use voltage reference sources other than a band-gap source, as desired for various applications.

The voltage references circuit 120 includes an op amp 122 that has an output terminal coupled to a gate terminal of a NMOS transistor 124. The NMOS transistor 124 has a drain terminal coupled to a Vdd voltage reference and a source terminal coupled to a feedback node 126. The feedback node 126 is coupled to an inverting input terminal of the op amp 122. A non-inverting input terminal of the op amp 122 receives the Vbg reference voltage. The feedback node 126 is coupled to one end of a resistor 128. The other end of the resistor 128 is coupled to a Vl node 130, at which is provided the Vl reference signal. The Vl node 130 is coupled through a resistor 132 to a ground, or 0 volt, reference terminal 134.

The Vl voltage is a function of the resistors 128,132 and the bandgap voltage Vbg. For good matching of resistors, the magnitude of the sawtooth signal 2 (Vm−Vl) depends on accuracy of the bandgap voltage Vbg.

With reference to FIG. 7 and FIG. 8 for a description of the structure and operation of one embodiment of the sawtooth generator circuit 306 of FIG. 2, FIG. 7 shows a more detailed circuit diagram and FIG. 8 shows various voltage waveforms for the sawtooth generator circuit 106.

The circuit of FIG. 7 generates the sawtooth signal Vstp as a sawtooth of increasing voltage that is started by a rising edge of the clock signal CLK and that is reset by the next rising edge of the clock signal CLK. The sawtooth generation circuit 106 includes an edge-triggered D flip-flop circuit 140 that has a clock terminal for receiving the CLK signal, which is substantially a square wave with a period of Tclk.

An inverted Q-output terminal qn of the D flip-flop 140 is coupled to a D-input terminal d. The D flip-flop circuit 142 changes state at the rising edge of the CLK signal in every Tclk time period as shown in FIG. 8. The Q-output signal and the inverted Q-output signal of the D flip-flop 140 are passed through a signal conditioning circuit 142 that prevents the Q-output signal and the inverted Q-output signal from overlapping. The conditioned output signals of the signal conditioning circuit 142 are coupled to a sawtooth generator circuit 144. These signals are a CmdP signal on a signal line 146 and an inverted CmdPb signal on a signal line 148 to the sawtooth generation circuit 144. FIG. 8 indicates that the signals CmdP and CmdPb are oppositely phased substantially square wave signal that each have a period of 2Tclk. The CmdP and CmdPb signals control operation of the sawtooth generation circuit 144.

The sawtooth generation circuit 144 includes a first CMOS inverter formed with a first PMOS pull-up transistor 156 and a first pull-down NMOS transistor 152. The first PMOS pull-up transistor 156 has a source terminal coupled to an input terminal 153 that receives the feedback current IregP from the charge pump circuit 116. The gate terminals of the transistors 156 and 152 are coupled together. The drain terminals of the transistors 156 and 152 are both coupled to a node 154. A first sawtooth capacitor 156 is coupled between the node 154 and a ground terminal 158a. The source terminal of the first pull-down NMOS transistor 152 is coupled to a terminal 160 at which is provided the low voltage Vl. The gate terminals of the transistors 156 and 152 are coupled to a first gate node 162 that receives the CmdP signal on the signal line 146.

The sawtooth generation circuit 144 also includes a second CMOS inverter formed with a second PMOS pull-up transistor 170 and a second pull-down NMOS transistor 172. The second PMOS pull-up transistor 170 has a source terminal that is also coupled to the input terminal 153 that receives the feedback current IregP from the charge pump circuit 116. The gate terminals and the drain terminals of the transistors 170 and 172 are coupled together. The drain terminals of the transistors 170 and 172 are both coupled to a node 174. A second sawtooth capacitor 176 is coupled between the node 174 and a ground terminal 158b. The source terminal of the second pull-down NMOS transistor 172 is coupled to the terminal 160 at which is provided the low voltage Vl. The gate terminals of the transistors 170 and 172 are coupled to a second gate node 182 that receives the CmdPb signal on the signal line 148.

A first NMOS coupling transistor 184 is coupled between the node 154 and a Vstp signal output node 186. A gate terminal of the first NMOS coupling transistor 184 is coupled to the second gate node 182 that receives the CmdPb signal on the signal line 148. Similarly, a second NMOS coupling transistor 188 is coupled between the node 174 and the Vstp signal output node 186. A gate terminal of the second NMOS coupling transistor 188 is coupled to the first gate node 162 that receives the CmdP signal on the signal line 146.

In operation, the sawtooth generator circuit 106 has the oppositely phased timing signals CmdP and CmdPb alternately provided from the signal conditioning circuit 142, as indicated in the timing diagram of FIG. 8. The sawtooth signal generator 106 receives the current signal IregP from the charge pump 116. The sawtooth signal generator 106 alternately directs the current signal IregP to charge one of the sawtooth capacitors 156, 176, while the other one of the sawtooth capacitors 176, 156 is discharged to the Vl voltage level at terminal 160.

A HIGH level of the CmdPb signal on signal line 148 turns on the second NMOS pull-down transistor 172 to couple the second sawtooth capacitor 176 to the Vl voltage at the Vl terminal 160 to discharge the second sawtooth capacitor 176 to the Vl voltage level. A HIGH level of the CmdPb signal on signal line 148 also turns on the first NMOS coupling transistor 184 to couple the NODE 154 and the sawtooth capacitor 156 to the Vstp output terminal 186. A corresponding LOW level of the CmdP signal on line 146 turns on the first pull-up PMOS transistor 156, which couples the IregP current at terminal 153 to node 154 to charge the first sawtooth capacitor 156 with the IregP current.

Alternately, a HIGH level of the CmdP signal on signal line 146 turns on the first NMOS pull-down transistor 152 to couple the first sawtooth capacitor 156 to the Vl voltage at the Vl terminal 160 to discharge the first sawtooth capacitor 156 to the Vl voltage level. A HIGH level of the CmdP signal on signal line 146 also turns on the second NMOS coupling transistor 188 to couple the NODE 174 and the sawtooth capacitor 176 to the Vstp output terminal 186. A corresponding LOW level of the CmdPb signal on line 148 turns on the second pull-up PMOS transistor 170, which couples the IregP current at terminal 153 to node 174 to charge the second sawtooth capacitor 176 with the IregP current.

FIG. 8 illustrates various voltage waveforms for the reference clock signal CLK. The Vclk signal is a square wave. The rising edge of Vclk triggers the oppositely phased CmdP and CmdPb signals. These two oppositely phased alternately charge and discharge the two sawtooth capacitors 156, 176 to produce the sawtooth voltage Vstp, which starts at the Vl voltage level.

Figure 9:
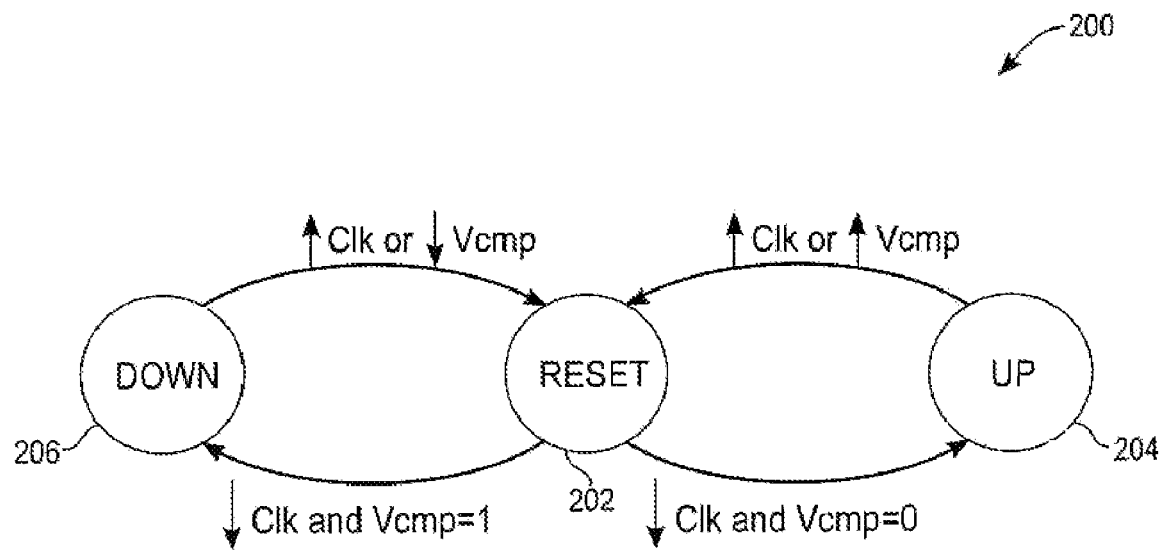
FIG. 9 is a state transition diagram for a phase frequency comparator for the amplitude controlled sawtooth generator of FIG. 2.
Figure 10:
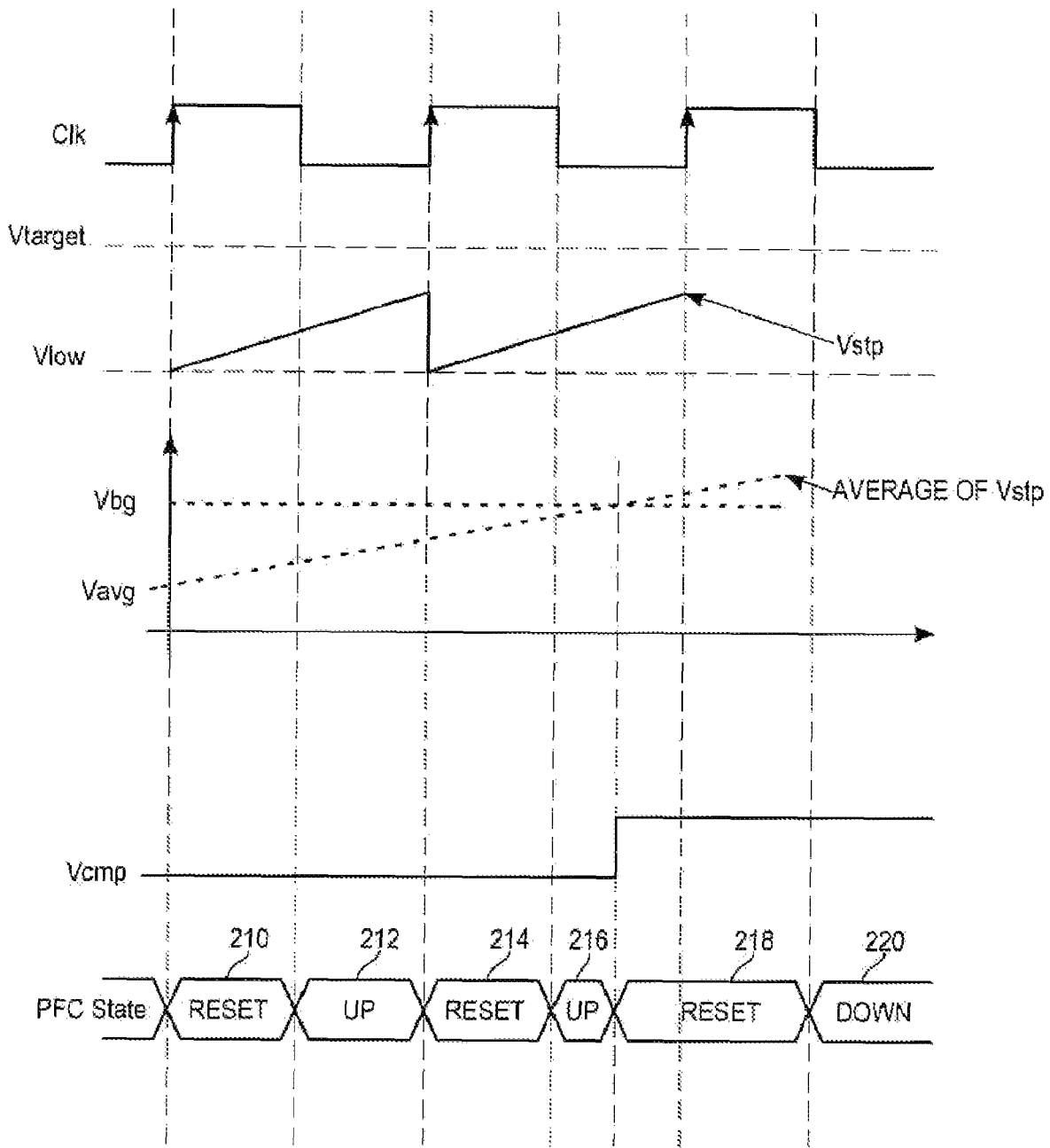
FIG. 10 is a timing diagram illustrating various signals for the phase frequency comparator of FIG. 8.

FIG. 9 is a state transition diagram 200 that describes operation of the phase frequency comparator (PFC) 112 of FIG. 2. FIG. 10 is a timing diagram illustrating various signals for the phase frequency comparator of FIG. 9. The state machine of the PFC 112 has 3 states: a RESET state 202, an UP state 204, and a DOWN state 206. The UP state 204 provides the UP output signal from the PFC 112 to the charge pump circuit 116 to increase the IregP current as indicated in FIG. 2. The Down state 206 provides the Down output signal from the PFC 112 to the charge pump circuit 116 to decrease the IregP current, also as indicated in FIG. 2. The RESET state holds the current IregP at the same value as previously directed.

The phase frequency comparator (PFC) 112 changes from the DOWN state 206 to the RESET state 202 either at the rising edge of CLK or at the falling edge of the output signal Vcmp of the voltage comparator 110. The phase frequency comparator (PFC) 112 changes from the UP state 204 to the RESET state 202 either at the rising edge of CLK or at the rising edge of the output signal Vcmp of the voltage comparator 110. The phase frequency comparator (PFC) 112 changes from the RESET state 202 to the DOWN state 206 at the falling edge of CLK together with Vcmp being at a HIGH, or 1, state. The phase frequency comparator (PFC) 112 changes from the RESET state 202 to the UP state 204 at the falling edge of CLK together with Vcmp being at a LOW, or 0, state.

FIG. 10 illustrates an example of the sawtooth signal generator system 100 starting up and not yet reaching a desired magnitude between Vl and Vtarget. FIG. 10 shows the CLK signal with its rising and falling edges. The output sawtooth signal Vstp is shown in a startup mode in which the final desired magnitude of the sawtooth has not yet reached a desired magnitude. The Vstp signal starts at the Vl, or Vlow, level and rises toward the Vtarget level. The rising Vavg signal from the sawtooth generator 106 and the low pass filter 108 is shown along with the constant level of the band-gap voltage. At the point where the Vavg signal is greater than the Vbg voltage level, the output signal Vcmp of the comparator 110 transitions to a HIGH level.

FIG. 10 illustrates the state of the phase frequency comparator PFC circuit 112. A first RESET state 210 occurs at the rising edge of the CLK signal. A first UP state 212 occurs when the CLK has a falling edge and VCMP is also LOW, or 0 volts. A second RESET state 214 occurs again a rising edge of the CLK signal. Another falling edge of the CLK signal together with a LOW Vcmp signal provides a second UP state. The second UP state 216 is cut short and changed to a third RESET state 218 at rising edge of the Vcmp signal. THE third RESET state 218 continues at the rising edge of the CLK signal. At the falling edge of the CLK signal with Vcmp HIGH, or 1, a first DOWN state 220 is entered.

If the desired magnitude of the sawtooth is not yet reached, for example, during the starting phase, the PFC 112 provides UP signals to the IregP current.

Figure 11:
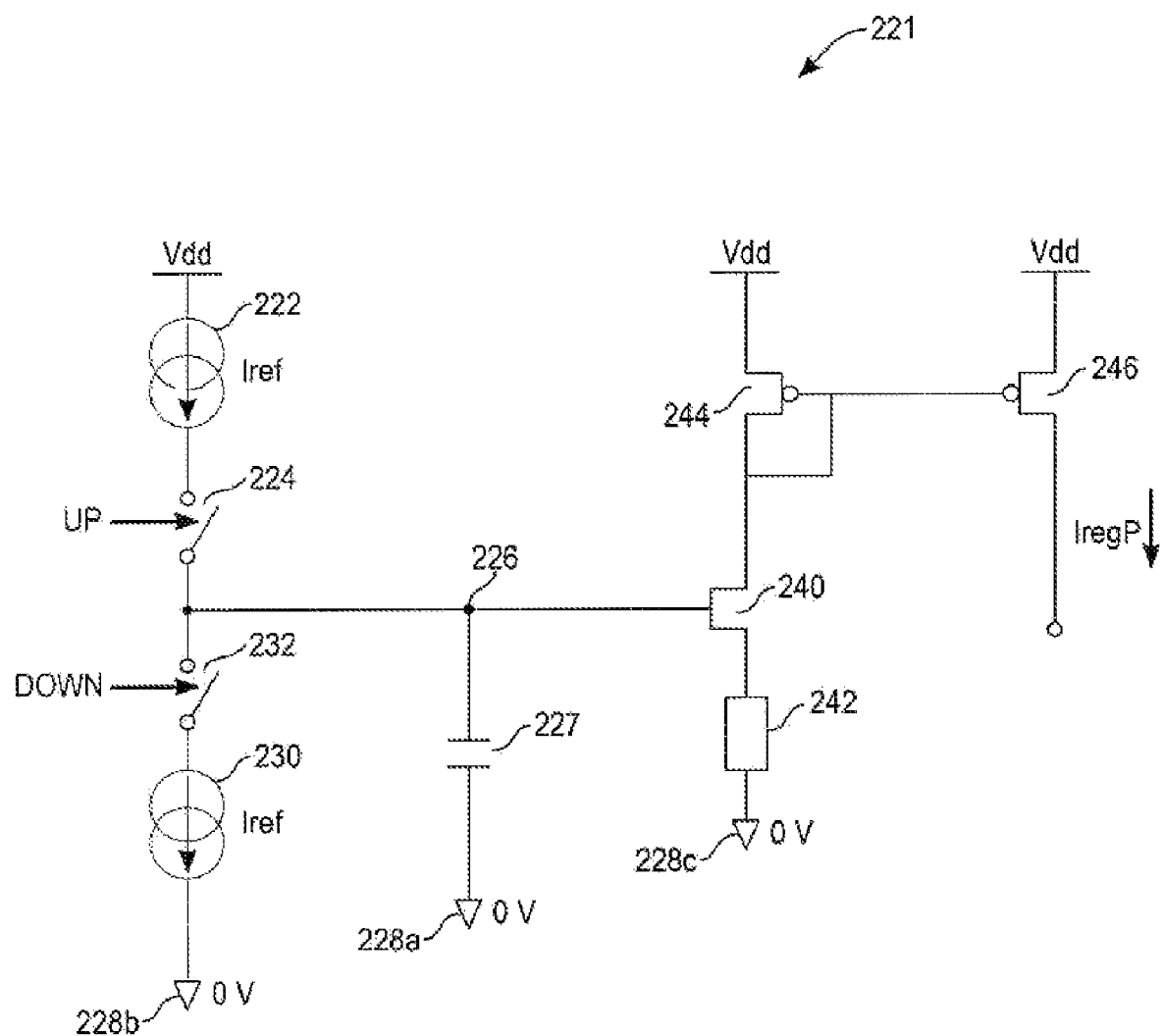
FIG. 11 is a circuit diagram for a charge pump for the amplitude controlled sawtooth generator of FIG. 2.

FIG. 11 illustrates one example of a charge pump circuit 221 that generates the IregP current for the sawtooth generator 106 of the amplitude controlled sawtooth generator of FIG. 2. A first constant current source 222 is coupled to a Vdd voltage source and, through a switch 224, to a capacitor reference node 226. The capacitor reference node 226 has a capacitor 227 coupled between it and a ground terminal 228a. The switch 224 is closed in response to an UP signal to provide an Iref current to the capacitor reference node 226 to charge the capacitor 227 with an Iref current. A constant current sink 230 is coupled to a ground terminal 228b and through a switch 232 to the capacitor reference node 226. The switch 232 is closed in response to a DOWN signal to draw an Iref current from the capacitor reference node 226 to discharge the capacitor 227 with an Iref current. The voltage at the capacitor reference node 226 is coupled to a gate terminal of an NMOS transistor 240. A source terminal of the NMOS transistor 240 is coupled through a resistor 242 to a ground terminal 228c to establish a current that passes from a diode-connected PMOS transistor 244 that has a gate terminal and a drain terminal coupled together to a drain terminal of the NMOS transistor 240. A source terminal of the diode-connected PMOS transistor 244 is coupled to the Vdd voltage source. The diode-connected PMOS transistor 244 and a second PMOS transistor 246 have their gate terminals coupled together to form a current mirror circuit. The second PMOS transistor 246 has a source terminal coupled to the Vdd voltage source. The drain terminal of the second PMOS transistor 246 provides a current IregP that tracks the voltage at the capacitor reference node 226 across the capacitor 227. When the UP signal and the DOWN signal are not active, the IregP current remains fixed.

During an "UP" sequence (i.e. UP=1 and DOWN=O), the capacitor 227 is charging through the Iref current source. This increases the voltage across the capacitor 227. The transistor 240 and the resistor 242 are used as a voltage-to-current converter. As voltage on capacitor 227 increases, the current through transistor 240 increases. The current is mirrored through transistors 244, 246 to generate the source current IregP. During a "DOWN" sequence (i.e. UP=0 and DOWN=1) the capacitor 227 is discharging through Iref current. This decreases the voltage across the capacitor 227. As capacitor 227 voltage decreases, the current through transistor 240 decreases. The current is mirrored through transistors 244, 246 to generate the source current IregP. When no action occurs on UP and DOWN signal the voltage stored on capacitor 227 maintains the regulated output current for the feedback loop.

The embodiment of the present invention illustrated in FIG. 2 provides a sawtooth signal, the magnitude of which is based on the average magnitude of that sawtooth signal. A phase comparator and a charge pump are in a current regulated loop that controls the magnitude of the sawtooth wave. The present invention provides a sawtooth generator that provides a sawtooth signal that has a precise amplitude and that is relatively insensitive to process variations. For that reason, no trimming is needed to calibrate the magnitude of the sawtooth signal. The present invention is based on charge per unit time, or current, that is provided by a voltage-to-current charge pump stage and that is injected into a capacitor in the sawtooth generator. The charge is proportional to the instantaneous phase error between the sawtooth wave generated by the current regulated loop and the reference clock calibrated with a duty cycle of 50 percent. The amplitude of the sawtooth is adjustable by varying the duty cycle of the reference clock.

An Amplitude Controlled Sawtooth Generator Based on a Fixed Voltage Vm

FIG. 12 illustrates another embodiment of a sawtooth signal generator system 300. The magnitude of the sawtooth signal is controlled using a version of the sawtooth signal that is the sawtooth signal itself and that is compared to a fixed reference voltage Vm. Components in this embodiment are similar to those in the previously discussed sawtooth signal generator system 100 of FIG. 2. In this embodiment a voltage reference circuit 302 provides a bandgap voltage Vbg as an input signal to a voltage reference circuit 304 that provides a low voltage Vl reference voltage to a sawtooth signal generator 306. The voltage reference circuit 304 also provides a Vm reference voltage to a negative input terminal of a comparator 310.

The sawtooth signal generator 306 of FIG. 12 receives a CLK signal and is controlled by a feedback current signal IregP. The sawtooth signal generator 306 provides an output sawtooth signal Vstp. A positive input terminal of a voltage comparator 310 receives the Vstp signal. A negative input terminal of the comparator 310 receives the Vm voltage. The Vm voltage is the average between a low point Vl and a high point Vh of the sawtooth signal. The voltage comparator 310 compares to every moment the magnitude of the Vstp signal to the Vm voltage and provides a corresponding comparator output signal Vcmp. If the level of the Vstp output signal is less than the Vm voltage level, the output voltage signal Vcmp of the voltage comparator 310 is a logic LOW. If the magnitude of the average of the sawtooth Vavg is greater than Vm, the output voltage signal Vcmp of the voltage comparator 310 is a logic HIGH.

FIG. 13 shows the Vm voltage level from the voltage reference circuit 304. FIG. 14 shows a Vtarget voltage level, where Vtarget is the peak value of the sawtooth signal. FIG. 14 also shows the low voltage Vl level and the Vm voltage level, where the starting point voltage level for the sawtooth signal waveform is the low voltage Vl level. FIG. 15 shows the output Vstp signal of the sawtooth signal generator 306 as a sawtooth signal Vstp that is centered on the value Vm.

FIG. 16 shows the voltage reference circuit 304 of FIG. 12 that provides a low voltage Vl reference voltage to the sawtooth generator 306 and an average voltage reference Vm to an inverting input of a comparator 310. The voltage references circuit 304 includes an op amp 322 that has an output terminal coupled to a gate terminal of a NMOS transistor 324. The NMOS transistor 324 has a drain terminal coupled to a Vdd voltage reference and a source terminal coupled to a feedback node 326, at which is provided the Vm voltage. The feedback node 326 is coupled to an inverting input terminal of the op amp 322. A non-inverting input terminal of the op amp 322 receives the Vbg reference voltage. The feedback node 326 is coupled to one end of a resistor 328. The other end of the resistor 328 is coupled to a Vl node 330, at which is provided the Vl reference signal. The Vl node 330 is coupled through a resistor 332 to a ground, or 0 volt, reference terminal 334.

FIG. 17 shows a more detailed circuit diagram of the sawtooth generator circuit 306 and FIG. 18 shows various voltage waveforms for the sawtooth generator circuit 306. The circuit of FIG. 17 generates the sawtooth signal Vstp as a sawtooth of increasing voltage that is started by a rising edge of the clock signal CLK and that is reset by the next rising edge of the clock signal CLK. The sawtooth generation circuit 306 includes an edge-triggered D flip-flop circuit 340 that has a clock terminal for receiving the CLK signal, which is substantially a square wave with a period of Tclk.

An inverted Q-output terminal qn of the D flip-flop 340 is coupled to a D-input terminal d. The D flip-flop circuit 342 changes state at the rising edge of the CLK signal in every Tclk time period as shown in FIG. 18. The Q-output signal and the inverted Q-output signal of the D flip-flop 340 are passed through a signal conditioning circuit 342 that prevents the Q-output signal and the inverted Q-output signal from overlapping. The conditioned output signals of the signal conditioning circuit 342 are CmdP signal on a signal line 346 and an inverted CmdPb signal on a signal line 348 to a sawtooth generation circuit 344. FIG. 18 indicates that the signals CmdP and CmdPb are oppositely phased substantially square wave signal that each have a period of 2Tclk. The CmdP and CmdPb signals control operation of the sawtooth generation circuit 344.

The sawtooth generation circuit 344 includes a first CMOS inverter formed with a first PMOS pull-up transistor 350 and a first pull-down NMOS transistor 352. The first PMOS pull-up transistor 350 has a source terminal coupled to an input terminal 353 that receives the feedback current IregP from the charge pump circuit 316. The gate terminals of the transistors 350 and 352 are coupled together. The drain terminals of the transistors 350 and 352 are both coupled to a node 354. A first sawtooth capacitor 356 is coupled between the node 354 and a ground terminal 358a. The source terminal of the first pull-down NMOS transistor 352 is coupled to a terminal 360 at which is provided the low voltage Vl. The gate terminals of the transistors 350 and 352 are coupled to a first gate node 362 that receives the CmdP signal on the signal line 346.

The sawtooth generation circuit 344 also includes a second CMOS inverter formed with a second PMOS pull-up transistor 370 and a second pull-down NMOS transistor 376. The second PMOS pull-up transistor 370 has a source terminal that is also coupled to the input terminal 353 that receives the feedback current IregP from the charge pump circuit 316. The gate terminals and the drain terminals of the transistors 370 and 376 are coupled together. The drain terminals of the transistors 370 and 376 are both coupled to a node 374. A second sawtooth capacitor 376 is coupled between the node 374 and a ground terminal 358b. The source terminal of the second pull-down NMOS transistor 376 is coupled to the terminal 360 at which is provided the low voltage Vl. The gate terminals of the transistors 370 and 376 are coupled to a second gate node 382 that receives the CmdPb signal on the signal line 348.

A first NMOS coupling transistor 384 is coupled between the node 354 and a Vstp signal output node 386. A gate terminal of the first NMOS coupling transistor 384 is coupled to the first gate node 382 that receives the CmdPb signal on the signal line 348. Similarly, a second NMOS coupling transistor 388 is coupled between the node 374 and the Vstp signal output node 386. A gate terminal of the second NMOS coupling transistor 388 is coupled to the first gate node 362 that receives the CmdP signal on the signal line 346.

In operation, the sawtooth generator circuit 306 has the oppositely phased timing signals CmdP and CmdPb alternately provided from the signal conditioning circuit 342, as indicated in the timing diagram of FIG. 8. The sawtooth signal generator 306 receives the current signal IregP from the charge pump 316. The sawtooth signal generator 306 alternately directs the current signal IregP to charge one of the sawtooth capacitors 356, 376 while the other one of the sawtooth capacitors 376, 356 is discharged to the Vl voltage level at terminal 360.

A HIGH level of the CmdPb signal on signal line 348 turns on the second NMOS pull-down transistor 376 to couple the second sawtooth capacitor 376 to the Vl voltage at the Vl terminal 360. A HIGH level of the CmdP signal on signal line 348 also turns on the first NMOS coupling transistor 384 to couple the node 354 and the sawtooth capacitor 356 to the Vstp output terminal 386. A corresponding LOW level of the CmdP signal on line 346 turns on the first pull-up PMOS transistor 350, which couples the IregP current at terminal 353 to node 354 to charge the first sawtooth capacitor 356 with the IregP current.

Alternately, a HIGH level of the CmdP signal on signal line 346 turns on the first NMOS pull-down transistor 352 to couple the first sawtooth capacitor 356 to the Vl voltage at the Vl terminal 360 to discharge the first sawtooth capacitor 356 to the Vl voltage level. A HIGH level of the CmdP signal on signal line 346 also turns on the second NMOS coupling transistor 388 to couple the node 374 and the sawtooth capacitor 376 to the Vstp output terminal 386. A corresponding LOW level of the CmdPb signal on line 348 turns on the second pull-up PMOS transistor 370, which couples the IregP current at terminal 353 to node 374 to charge the second sawtooth capacitor 376 with the IregP current.

FIG. 18 illustrates various voltage waveforms for the reference clock signal CLK. The Vclk signal is a square wave. The rising edge of Vclk triggers the oppositely phased CmdP and CmdPb signals. These two oppositely phased alternately charge and discharge the two sawtooth capacitors 356, 376 to produce the sawtooth voltage Vstp, which starts at the Vl voltage level.

FIG. 19 is a state transition diagram for the phase frequency comparator (PFC) 312 for the amplitude controlled sawtooth generator of FIG. 12. The phase frequency comparator 312 compares the comparator output signal Vcmp of the voltage comparator 310 with the falling edge of the reference CLK output signal from a reference clock circuit 314. As discussed herein below, an embodiment of the pfc 312 is implemented as a state machine. The clock circuit 314 includes final calibration bits for adjusting the CLK duty cycle. For each period of the CLK signal at the falling edge of the CLK signal, the pfc 312 provides either an UP output signal or a DOWN output signal to a charge pump circuit 316. The charge pump circuit 316 provides the output current IregP to the sawtooth signal generator 306 on a signal line 318. A current feedback loop is formed by the sawtooth signal generator 306, the voltage comparator 310, the pfc 312, and the charge pump 316 that provides the IregP signal to the sawtooth generator 306.

Figure 20:
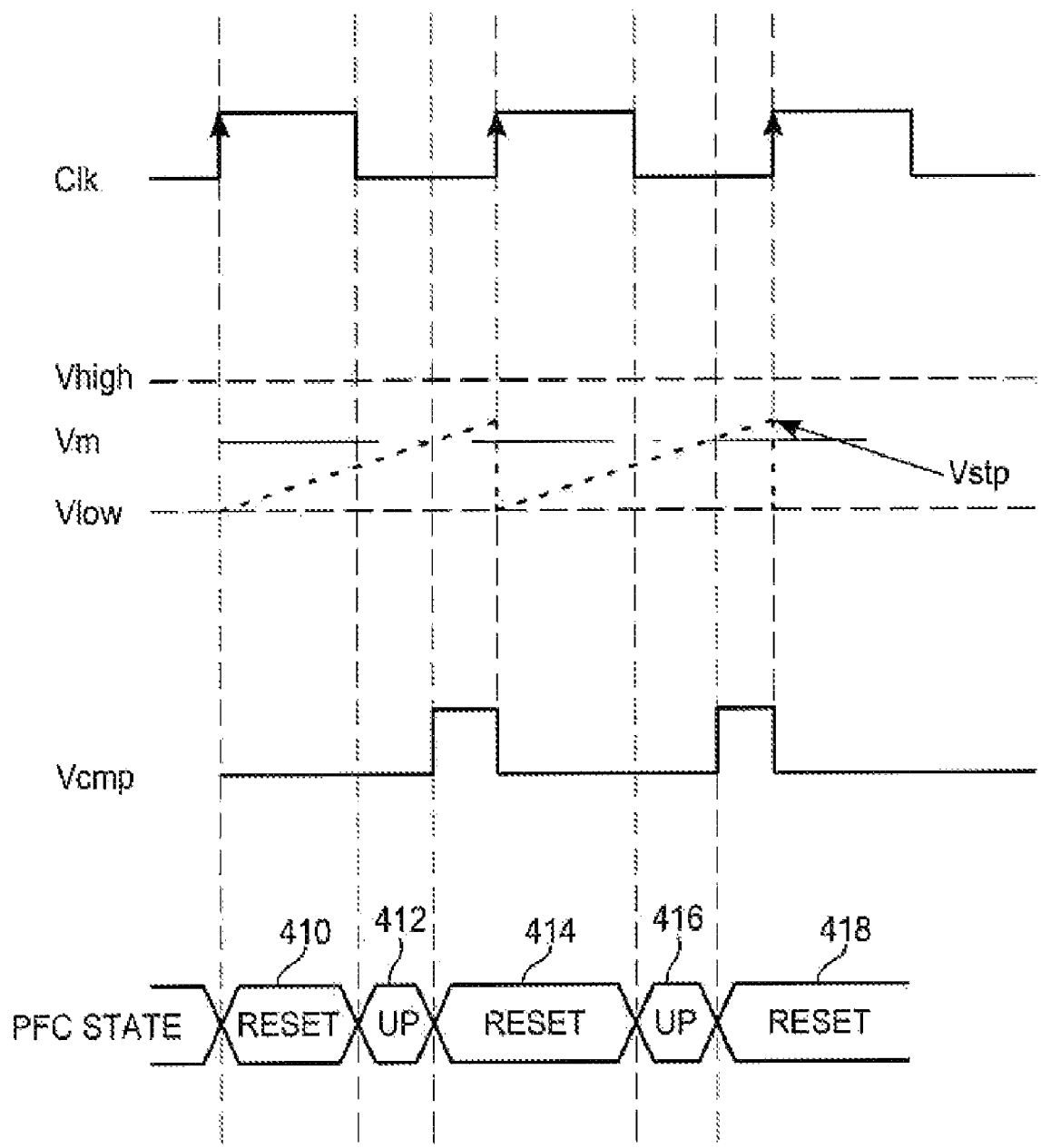
FIG. 20 is a timing diagram illustrating various signals for the phase frequency comparator of FIG. 19.

FIG. 20 is a timing diagram illustrating various signals for the phase frequency comparator of FIG. 19.

FIG. 20 illustrates an example of the sawtooth signal generator system 300 starting up and not yet reaching a desired magnitude between Vlow, Vl, and Vhigh, Vh. FIG. 20 shows the CLK signal with its rising and falling edges. The output sawtooth signal Vstp is shown in a startup mode in which the final desired magnitude of the sawtooth has not yet reached a desired magnitude. The Vstp signal starts at the Vl, or Vlow, level and rises toward the Vhigh level. At the point where the Vm signal is less than the Vstp voltage level, the output signal Vcmp of the comparator 310 transitions to a HIGH level. At the point where the Vm signal is greater than the Vm signal level, the output signal Vcmp of the comparator 310 transitions to a LOW level.

FIG. 20 also illustrates the state of the phase frequency comparator PFC circuit 312. A RESET state 410 occurs at the rising edge of the CLK signal. An UP state 412 occurs when the CLK has a falling edge and VCMP is also LOW, or 0 volts. When Vcmp goes HIGH, a second RESET state 414 occurs and remains after a rising edge of the CLK signal. Another falling edge of the CLK signal together with a LOW Vcmp signal provides a second UP state 416. The second UP state 416 is cut short and changed to a third RESET state 418 at rising edge of the Vcmp signal. The third RESET state 418 continues at the rising edge of the CLK signal. If the desired magnitude of the sawtooth is not yet reached, for example, during the starting phase, the PFC 312 continues to provide UP signals to the IregP current.

Figure 21:
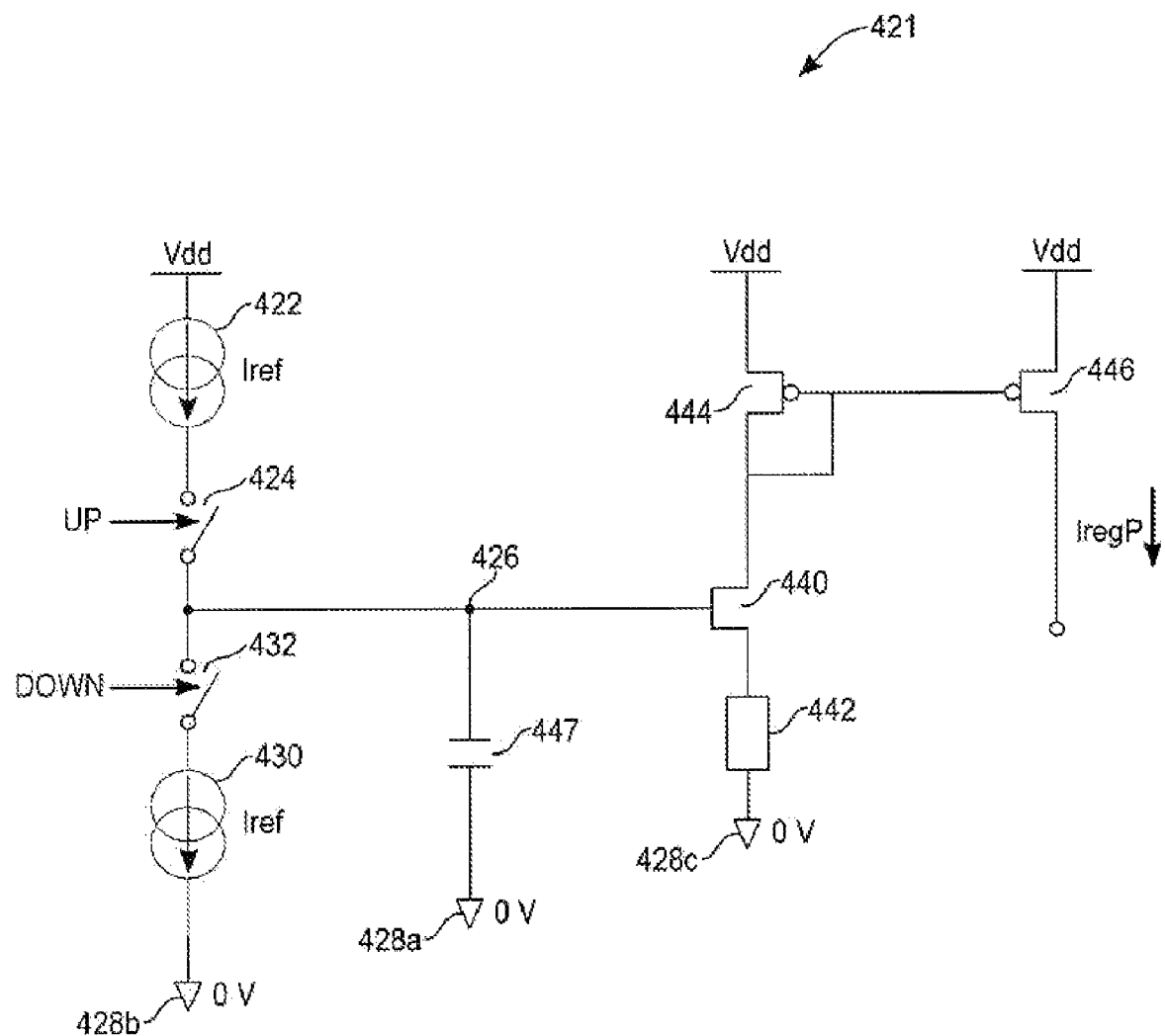
FIG. 21 is a circuit diagram for a charge pump for the amplitude controlled sawtooth generator of FIG. 12.

FIG. 21 illustrates one example of a charge pump circuit 420 that generates the IregP current for the sawtooth generator 306 of FIG. 12. A first constant current source 422 is coupled to a Vdd voltage source and, through a switch 424, to a capacitor reference node 426. The capacitor reference node 426 has a capacitor 447 coupled between it and a ground terminal 428a. The switch 424 is closed in response to an UP signal to provide an Iref current to the capacitor reference node 426 to charge the capacitor 447 with an Iref current.

A constant current sink 430 is coupled to a ground terminal 428b and through a switch 432 to the capacitor reference node 426. The switch 432 is closed in response to a DOWN signal to draw an Iref current from the capacitor reference node 426 to discharge the capacitor 447 with an Iref current.

The voltage at the capacitor reference node 426 is coupled to a gate terminal of an NMOS transistor 440. A source terminal of the NMOS transistor 440 is coupled through a resistor 442 to a ground terminal 428c to establish a current that passes from a diode-connected PMOS transistor 444 that has a gate terminal and a drain terminal coupled together to a drain terminal of the NMOS transistor 440. A source terminal of the diode-connected PMOS transistor 444 is coupled to the Vdd voltage source. The diode-connected PMOS transistor 444 and a second PMOS transistor 446 have their gate terminals coupled together to form a current mirror circuit. The second PMOS transistor 446 has a source terminal coupled to the Vdd voltage source. The drain terminal of the second PMOS transistor 446 provides a current IregP that tracks the voltage at the capacitor reference node 426 across the capacitor 447. When the UP signal and the DOWN signal are not active, the IregP current remains fixed.

During the "UP" sequence (i.e. UP=1 and Down=O), the capacitor 447 is charging through the Iref current source. This increases the voltage across the capacitor 447. The transistor 440 and the resistor 442 are used as a voltage-to-current converter. As voltage on capacitor 447 increases, the current through transistor 440 increases. That current is mirrored through transistors 444, 446 to generate the source current IregP. During a "DOWN" sequence (i.e. UP=0 and DOWN=1) the capacitor 447 is discharging through the Iref current. This decreases the voltage across the capacitor 447. As the capacitor 447 voltage decreases, the current through transistor 440 decreases. The current is mirrored through transistors 444, 446 to generate the source current IregP. When no action occurs on UP and DOWN signal the voltage stored on capacitor 447 maintains as the regulated output current for the feedback loop.

The embodiment of the present invention of FIG. 12 provides a sawtooth signal, the magnitude of which is based on the Vm voltage which is the average between Vh and Vl. A phase comparator and a charge pump are in a current regulated loop that controls the magnitude of the sawtooth wave. The present invention provides a sawtooth generator that provides a sawtooth signal with a precise amplitude and that is relatively insensitive to process variations. For that reason, no trimming is needed to calibrate the magnitude of the sawtooth signal. The present invention is based on charge per unit time, or current, that is provided by a voltage-to-current charge pump stage and that is injected into a capacitor in the sawtooth generator. The charge is proportional to the instantaneous phase error between the sawtooth wave generated by the current regulated loop and the reference clock calibrated with a duty cycle of 50 percent. The amplitude of the sawtooth is adjustable by varying the duty cycle of the reference clock.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

What is claimed is:

1. A sawtooth signal generator, comprising:
 a sawtooth voltage generator having a first capacitor that is charged with a variable feedback control current to provide a sawtooth output signal with an amplitude controlled by the variable feedback control current;

a feedback loop including a comparator that compares an average value of the sawtooth output signal with a fixed voltage reference and that provides a comparator output signal to a phase frequency comparator configured to output up/down control signals; and a charge pump circuit to be controlled using the up/down control signals from the phase frequency comparator to output the variable feedback control current.

2. The sawtooth signal generator of claim 1 wherein the phase frequency comparator provides control signals to increase, maintain, or decrease the variable feedback control current from the source of the variable feedback control current.

3. The sawtooth signal generator of claim 1 wherein the phase frequency comparator includes a state machine that receives the comparator output signal and a clock signal to provide an output signal that increases the variable feedback control current signal and an output signal that decreases the variable feedback control current signal.

4. The sawtooth signal generator of claim 1 wherein the sawtooth voltage generator starts the sawtooth signal from a low voltage reference value.

5. The sawtooth signal generator of claim 1, wherein the fixed voltage reference is derived from a bandgap voltage reference source.

6. The sawtooth signal generator of claim 1, wherein the charge pump circuit includes a constant current source and a constant current sink, the constant current source and the constant current sink controlled by output signals of the phase frequency comparator.

7. The sawtooth signal generator of claim 5 wherein the phase frequency comparator provides control signals to increase, maintain, or decrease the variable feedback control current from the source of the variable feedback control current.

8. A sawtooth signal generator, comprising:
a sawtooth voltage generator having a first capacitor that is charged with a variable feedback control current to provide a sawtooth output signal with an amplitude controlled by the variable control current; and
a feedback loop including a comparator that compares a version of the sawtooth output signal with a fixed voltage reference and that provides a comparator output signal to a phase frequency comparator, the output of which controls a source of the variable feedback control current, wherein the version of the sawtooth output signal includes an average value of the sawtooth output signal.

9. A sawtooth signal generator, comprising:
a sawtooth voltage generator having a first capacitor that is charged with a variable feedback control current to provide a sawtooth output signal with an amplitude controlled by the variable control current; and
a feedback loop including a comparator that compares a version of the sawtooth output signal with a fixed voltage reference and that provides a comparator output signal to a phase frequency comparator, the output of which controls a source of the variable feedback control current, wherein the sawtooth voltage generator includes a second capacitor and wherein the first and second capacitors are alternately charged and discharged to provide the sawtooth output signal that is controlled by the variable feedback control current.

10. The sawtooth signal generator of claim 9, wherein the variable feedback control current is provided by a charge pump circuit that is controlled by the output of the phase frequency comparator.

11. A dual-capacitor sawtooth generation circuit, comprising:
a sawtooth generator control circuit that receives a reference clock signal and that provides a first sawtooth command signal and a second complementary sawtooth command signal to a sawtooth voltage generator circuit;
the sawtooth voltage generator circuit includes a first sawtooth capacitor and a second sawtooth capacitor;
the sawtooth voltage generator circuit receives: a low voltage reference voltage, the first sawtooth command signal, the second complementary sawtooth command signal, and a control current signal;
the sawtooth voltage generator circuit has an output terminal at which is provided a sawtooth output signal; and
wherein the first sawtooth command signal and the second complementary sawtooth command signal alternatively connect one of the first and second sawtooth capacitors to the control current signal and to the output terminal for the sawtooth output signal while also connecting the other of the first and second sawtooth capacitors to the low voltage reference voltage so that each of the sawtooth capacitors alternately provides a sawtooth output signal that starts at the low voltage reference voltage level to the output terminal.

12. The dual-capacitor sawtooth generation circuit of claim 11, including:
a first CMOS inverter having an output terminal coupled to a first sawtooth capacitor; an input terminal of the first CMOS inverter coupled to receive the first sawtooth command signal;
a second CMOS inverter having an output terminal coupled to the second sawtooth capacitor;
an input terminal of the second CMOS inverter coupled to receive the second complementary sawtooth command signal;
a first NMOS coupling transistor coupled between the first sawtooth capacitor and a sawtooth signal output node, wherein a gate terminal of the first NMOS coupling transistor receives the first sawtooth command signal;
a second NMOS coupling transistor coupled between the second sawtooth capacitor and the sawtooth signal output node, wherein a gate terminal of the first NMOS coupling transistor receives the first sawtooth command signal;
wherein a gate terminal of the second NMOS coupling transistor receives the first sawtooth command signal; and
wherein the control current signal alternately charges one of the sawtooth capacitors while the other one of the sawtooth capacitors is discharged to the low voltage reference voltage.

13. A sawtooth generator, comprising:
a dual-capacitor sawtooth voltage generator that includes a first sawtooth capacitor and a second sawtooth capacitor, that receives a low voltage reference voltage, that receives a first sawtooth command signal, that receives a second complementary sawtooth command signal, that receives a feedback current signal from a charge pump circuit, and that has a sawtooth output terminal at which is provided a sawtooth output signal; and
wherein the first sawtooth command signal and the second complementary sawtooth command signal alternatively couple one of the first and second sawtooth capacitors to the feedback current signal and to the sawtooth output terminal while also coupling the other of the first and second sawtooth capacitors to the low voltage reference voltage so that each of the sawtooth capacitors alternately provides a sawtooth output signal that starts at the low voltage reference voltage;
a comparator circuit that compares a reference voltage level to a version of the sawtooth output signal and that provides a comparator output signal;
a phase frequency comparator that receives the comparator output voltage and a clock signal and that provides as outputs an UP signal and a DOWN signal, where the UP signal indicates that the version of the sawtooth signal is less than the reference voltage level and where the DOWN signal indicates that the version of the sawtooth signal is greater than the reference voltage level; and
a charge pump circuit that receives the UP signal to provide an increase in the feedback current signal and that receives the DOWN signal to provide a decrease in the feedback current signal.

14. The sawtooth generator of claim 13 including an averaging circuit that receives the sawtooth output signal and that provides an average value signal of the sawtooth output signal as a version of the sawtooth output signal.

15. The sawtooth generator of claim 13 wherein the sawtooth output signal is provided as a version of the sawtooth output signal.

16. The sawtooth generator of claim 13 wherein the reference voltage level is derived from a bandgap voltage reference.

17. The sawtooth generator of claim 13 wherein the dual-capacitor sawtooth voltage generator circuit includes:
a first CMOS inverter coupled between a node for the feedback current from the charge pump circuit and a node for the low voltage reference voltage;
an output terminal of the first CMOS inverter coupled to one terminal of a first sawtooth capacitor with another terminal of the first sawtooth capacitor coupled to a ground terminal;
an input terminal of the first CMOS inverter coupled to receive the first sawtooth command signal;
a second CMOS inverter also coupled between the node for the feedback current from the charge pump circuit and the node for the low voltage reference voltage;
an output terminal of the second CMOS inverter coupled to one terminal of a second sawtooth capacitor with another terminal of the second sawtooth capacitor coupled to a ground terminal;
an input terminal of the second CMOS inverter coupled to receive the second complementary sawtooth command signal;
a first NMOS coupling transistor coupled between one terminal of the first sawtooth capacitor and a sawtooth signal output node, wherein a gate terminal of the first NMOS coupling transistor receives the first sawtooth command signal;
a second NMOS coupling transistor coupled between one terminal of the second complementary sawtooth command signal and the sawtooth signal output node, wherein a gate terminal of the second NMOS coupling transistor receives the first sawtooth command signal; and
wherein the sawtooth signal generator alternately directs the feedback current signal to charge one of the sawtooth capacitors while the other one of the sawtooth capacitors is discharged to the low voltage reference voltage level.

18. The sawtooth generator of claim 13 wherein the phase frequency comparator is a state machine that provides the UP signal in an UP state to provide an increase in the feedback current signal, that provides the DOWN signal in the DOWN state to provide a decrease in the feedback current signal, and that provides a RESET state in which neither an UP signal or a DOWN signal is provided.

19. The sawtooth generator of claim 18 wherein:
the state machine changes from the DOWN state to the RESET state either at the rising edge of the clock signal or at the falling edge of the comparator output signal of the voltage comparator;
the state machine changes from the UP state to the RESET state either at the rising edge of the clock signal or at the rising edge of the comparator output signal of the voltage comparator;
the state machine changes from the RESET state to the DOWN state at the falling edge of the clock signal together with the comparator output signal being at a HIGH state; and
the state machine changes from the RESET state to the UP state at the falling edge of CLK together with the comparator output signal being at a LOW state.

20. The sawtooth generator of claim 13 wherein the charge pump circuit includes:
a constant current source that is coupled through a first switch to a reference capacitor node that has a reference capacitor coupled between it and a ground terminal, such that the first switch is closed in response to an UP signal to provide a reference charging current to the reference capacitor; and
a constant current sink that is coupled through a second switch to the capacitor reference node, such that the second switch is closed in response to a DOWN signal to draw an a reference discharging current from the reference capacitor to discharge the reference capacitor.

21. The sawtooth generator of claim 20, including a current mirror circuit that converts the voltage across the reference capacitor to the feedback current signal.

22. A signal generating method, comprising:
controlling the amplitude of a sawtooth output signal by charging a capacitor in a sawtooth voltage generator with a variable feedback control current;
comparing a version of the sawtooth output signal with a fixed reference voltage to provide a comparator output signal;
processing the comparator output signal in a phase frequency comparator to provide up/down control signals;
controlling a charge pump circuit using the up/down control signals received from the phase frequency comparator to output the variable feedback control; and
wherein comparing a version of the sawtooth output signal with a fixed reference voltage to provide a comparator output signal includes comparing an average value of the sawtooth output signal with the fixed reference voltage.

23. The method of claim 22 including providing control signals using the phase frequency comparator for increasing, maintaining, or decreasing the variable feedback control current.

24. The method of claim 22 including providing control signals for increasing, maintaining, or decreasing the variable feedback control current with a state machine; and
receiving the comparator output signal and a clock signal using the state machine to provide the control signals for the source of the variable feedback control current.

25. A method of generating a sawtooth signal that has a controlled amplitude, comprising:

controlling the amplitude of a sawtooth output signal by charging a capacitor in the sawtooth voltage generator with a variable feedback control current;

comparing a version of the sawtooth output signal with a fixed reference voltage to provide a comparator output signal;

processing the comparator output signal in a phase frequency comparator to provide up/down control signals;

controlling a source of the variable feedback control current with the up/down control signals from the phase frequency comparator; and wherein comparing a version of the sawtooth output signal with a fixed reference voltage to provide a comparator output signal includes comparing an average value of the sawtooth output signal with the fixed reference voltage.

* * * * *

UNITED STATES PATENT AND TRADEMARK OFFICE
CERTIFICATE OF CORRECTION

| | | |
|---|---|---|
| PATENT NO. | : 7,671,642 B2 | Page 1 of 2 |
| APPLICATION NO. | : 11/610107 | |
| DATED | : March 2, 2010 | |
| INVENTOR(S) | : Daniel Payrard et al. | |

It is certified that error appears in the above-identified patent and that said Letters Patent is hereby corrected as shown below:

In column 1, line 37, after "as" insert -- : --.

In column 3, line 40, before "amplitude" delete "for the".

In column 3, line 41, after "FIG. 12" insert -- . --.

In column 4, line 31, delete "of," and insert -- of --, therefor.

In column 12, line 16, delete "the" and insert -- an --, therefor.

In column 13, line 10, in Claim 2, after "provides" insert -- up/down --.

In column 13, lines 12-13, in Claim 2, delete "source of the variable feedback control current." and insert -- charge pump. --, therefor.

In column 13, lines 17-19, in Claim 3, delete "an output signal that increases the variable feedback control current signal and an output signal that decreases the variable feedback control current signal." and insert -- the up/down control signals. --, therefor.

In column 13, lines 29-30, in Claim 6, delete "output signals of the phase frequency comparator." and insert -- the up/down control signals. --, therefor.

In column 13, line 31, in Claim 7, after "claim 5" insert -- , --.

In column 14, line 37, in Claim 12, delete "a sawtooth signal output node," and insert -- the output terminal, --, therefor.

In column 14, lines 41-42, in Claim 12, delete "sawtooth signal output node," and insert -- output terminal, --, therefor.

In column 14, line 60, in Claim 13, delete "signal; and" and insert -- signal, --, therefor.

Signed and Sealed this

Eighteenth Day of May, 2010

David J. Kappos
*Director of the United States Patent and Trademark Office*

CERTIFICATE OF CORRECTION (continued)
U.S. Pat. No. 7,671,642 B2

In column 15, line 13, in Claim 13, delete "a" and insert -- the --, therefor.

In column 15, line 34, in Claim 17, delete "a" and insert -- the --, therefor.

In column 15, line 43, in Claim 17, delete "a" and insert -- the --, therefor.

In column 15, lines 50-51, in Claim 17, delete "a sawtooth signal output node," and insert -- the sawtooth output terminal, --, therefor.

In column 15, lines 55-56, in Claim 17, delete "complementary sawtooth command signal and the sawtooth signal output node," and insert -- sawtooth capacitor and the sawtooth output terminal, --, therefor.

In column 15, line 58, in Claim 17, delete "first" and insert -- second --, therefor.

In column 16, line 5, in Claim 19, after "claim 18" insert -- , --.

In column 16, line 33, in Claim 20, after "draw" delete "an".

In column 16, line 50, in Claim 22, delete "control;" and insert -- control current; --, therefor.

In column 16, line 55, in Claim 23, after "providing" insert -- the up/down --.

In column 16, lines 60-65, in claim 24, delete "24. The method of claim 22 including providing control signals for increasing, maintaining, or decreasing the variable feedback control current with a state machine; and
receiving the comparator output signal and a clock signal using the state machine to provide the control signals for the source of the variable feedback control current."
and insert -- 24. The method of Claim 22 wherein processing includes
receiving the comparator output signal and a clock signal at a state machine of the phase frequency comparator; and
providing the up/down control signals for increasing, maintaining, or decreasing the variable feedback control current using the state machine. --, therefor.